(12) United States Patent
Sugamoto et al.

(10) Patent No.: US 7,663,392 B2
(45) Date of Patent: Feb. 16, 2010

(54) SYNCHRONOUS SEMICONDUCTOR DEVICE, AND INSPECTION SYSTEM AND METHOD FOR THE SAME

(75) Inventors: Hiroyuki Sugamoto, Kasugai (JP);
Hidetoshi Tanaka, Kasugai (JP);
Yasushige Ogawa, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 12/112,782

(22) Filed: Apr. 30, 2008

(65) Prior Publication Data
US 2008/0204067 A1   Aug. 28, 2008

Related U.S. Application Data

(62) Division of application No. 11/014,789, filed on Dec. 20, 2004, now Pat. No. 7,378,863, which is a division of application No. 10/373,869, filed on Feb. 27, 2003, now Pat. No. 6,891,393, which is a division of application No. 09/820,715, filed on Mar. 30, 2001, now Pat. No. 6,559,669.

(30) Foreign Application Priority Data
Nov. 30, 2000   (JP)   ............................. 2000-365053

(51) Int. Cl.
*G01R 31/28* (2006.01)
*G11C 7/00* (2006.01)

(52) U.S. Cl. .......................... 324/765; 365/201; 714/42

(58) Field of Classification Search ................. 324/763, 324/765; 365/201; 714/42, 718, 733
See application file for complete search history.

(56) References Cited

U.S. PATENT DOCUMENTS

| 5,394,443 | A | 2/1995 | Byers et al. |
| 5,467,468 | A | 11/1995 | Koshikawa |
| 5,627,478 | A | 5/1997 | Habersetzer et al. |
| 5,727,001 | A | 3/1998 | Loughmiller |
| 5,808,961 | A | 9/1998 | Sawada |
| 6,061,285 | A | 5/2000 | Tsukikawa |
| 6,385,125 | B1 * | 5/2002 | Ooishi et al. ............. 365/233.1 |
| 6,470,467 | B2 * | 10/2002 | Tomishima et al. ......... 714/744 |
| 6,489,819 | B1 | 12/2002 | Kono et al. |
| 6,546,503 | B2 | 4/2003 | Ooishi |

* cited by examiner

*Primary Examiner*—Ernest F Karlsen
(74) *Attorney, Agent, or Firm*—Arent Fox LLP

(57) ABSTRACT

The present invention provides a synchronous semiconductor device suitable for improving the efficiency of application of electrical stresses to the device, an inspection system and an inspection method thereof in order to efficiently carrying out a burn-in stress test. A command latch circuit having an access command input will output a low-level pulse in synchronism with an external clock. The pulse will pass through a NAND gate of test mode sequence circuit and a common NAND gate to output a low-level internal precharge signal, which will reset a word line activating signal from the control circuit. Simultaneously, an internal precharge signal passing through the NAND gate will be delayed by an internal timer a predetermined period of time to output through the NAND gate a low-level internal active signal, which will set a word line activating signal from the control circuit.

2 Claims, 13 Drawing Sheets

FIG.2 CONTROLLER CIRCUIT OF WORD LINES IN ACCORDANCE WITH FIRST EMBODIMENT

FIG.4 BLOCK DIAGRAM OF A CIRCUIT IN ACCORDANCE WITH SECOND EMBODIMENT

FIG.5 CONTROLLER CIRCUIT OF WORD LINES IN ACCORDANCE WITH SECOND EMBODIMENT

FIG.8 CONTROLLER CIRCUIT OF WORD LINES IN ACCORDANCE WITH THIRD EMBODIMENT

FIG.9 OPERATING WAVEFORMS IN ACCORDANCE WITH THIRD EMBODIMENT

CONTROLLER CIRCUIT OF WORD LINES IN ACCORDANCE WITH PRIOR ART

OPERATING WAVEFORMS IN ACCORDANCE WITH PRIOR ART

CONTROLLER CIRCUIT OF WORD LINES IN ACCORDANCE WITH ANOTHER PRIOR ART

OPERATING WAVEFORMS IN ACCORDANCE WITH ANOTHER PRIOR ART

SYNCHRONOUS SEMICONDUCTOR DEVICE, AND INSPECTION SYSTEM AND METHOD FOR THE SAME

This Divisional Application claims the benefit of U.S. patent application Ser. No. 11/014,789, filed Dec. 20, 2004, now U.S. Pat. No. 7,378,863 which in turn is a Divisional Application of Parent application Ser. No. 10/373,869, filed Feb. 27, 2003 now U.S. Pat. No. 6,891,393, which in turn is a Divisional Application of Parent application Ser. No. 09/820, 715, filed Mar. 30, 2001 now U.S. Pat. No. 6,559,669. The disclosure of the prior applications is hereby incorporated herein in their entirety by reference.

BACKGROUND OF THE INVENTION

1. Field of the Invention

The present invention relates to a synchronous semiconductor device and an inspection system for synchronous semiconductor devices, and more particularly to a synchronous semiconductor device and an inspection system for synchronous semiconductor device, incorporating a function to effectively perform burn-in stress test for screening defective products.

2. Description of the Prior Art

Any residual ionized movable impurity in the oxide of a semiconductor device may lead in practice to a permanent defective such as degenerated capacity to voltage and short circuit between wirings due to the displacement of such impurity caused by thermal or electric stresses. In order to eliminate these potentially problematic devices as defectives from final products prior to shipping, a burn-in stress test is performed. The burn-in stress test consists of a screening test by applying thermal and electric stresses to the subject.

The burn-in stress test is performed on the synchronous semiconductors in a similar manner. The synchronous semiconductors execute its internal operation in synchronism with an external clock. In order to apply electric stresses to the inside device, the operation is to be configured at the rate of the external clock.

For example, in a synchronous dynamic random access memory (referred to as SDRAM herein below), electric stresses will be at maximum when a word line is selected and a voltage more risen to the power supply voltage is applied to the gate of a MOS transistor. In order to apply to the entire device some electrical stresses, the selected word line has to be sequentially changed. Although by the demand of high-speed operation in these days a next generation SDRAM has been developed which enables accelerated cyclic operation by performing a series of data accesses in one command input, the burn-in stress test is indispensable for such products.

The prior art technology with respect to the ordinary SDRAM will be described by referring to the controller circuit of word lines shown in FIG. 10, and operating waveforms in FIG. 11. In the art, a control command CMD and a precharging command PRE_CMD may be input synchronously at the rising edge of an external clock CLK. A latch 110, 110 in a command latch circuit 100, 100 accepts the external clock CLK at an input and at the other input the output from a NAND circuit 130, 130 that receives the commands CMD and PRE_CMD and the external clock CLK, CLK. When the external clock CLK, CLK goes to high if either the control command CMD or the precharging command PRE_CMD is high then this command status will be latched. A one-shot trigger circuit 120, 120 in the following stage will be triggered by the transition of the output of the latch 110, 110 to low when latching so as to output a low-level pulse signal having the width determined by a series of inverters of odd stages (only three stages shown in FIG. 10). The pulse signal means an internal active signal ACTV, or an internal precharge signal PRE, which will set and reset the activating signal WL of word lines by repeatedly setting and resetting the latch 210 in the controller circuit 200 alternately and in synchronism with the rising edge of the external clock CLK, CLK. When resetting, the word line next to the one currently selected will be selected such that electrical stress will be applied sequentially through the device thoroughly.

Another prior art technology with respect to the next generation SDRAM will be described by referring to a controller circuit of word lines shown in FIG. 12 and to operating waveforms shown in FIG. 13. In this prior art, a circuit block 100 identical to the command latch circuit 100, 100 shown in FIG. 10 is implemented so as to accept the control command CMD synchronously input at the rising edge of an external clock CLK. A following one-shot trigger circuit 120 at the next stage will output a predetermined pulse at low-level. This low-level pulse is an internal active signal ACTV, which will be input to the controller circuit 200 to output to the word line activating signal WL.

The internal active signal ACTV is also input to an internal timer circuit 300. The internal timer circuit 300 can be composed of inverters of even stages as shown in FIG. 12, and may be composed of any arrangements which measure the given time t1. When the given time t1 elapses, the circuit outputs a low-level pulse signal for an internal precharge signal PRE to reset the latch 210 in the controller circuit 200 to deactivate the word line activating signal WL. Since in this next generation SDRAM, one command input causes a series of data accesses to be performed, the internal precharge signal PRE will be automatically issued after elapsing the given time t1 configured by the internal timer circuit 300 based on the internal active signal ACTV.

The word line activating signal WL activates the word line corresponding to a row address selected by the circuit not shown in the figure to apply electric stress during the given time t1 configured by the internal timer circuit 300. At the end of the given time t1, the activated word line will be deactivated and a next word line will be set. Then the identical operation will be iteratively repeated at the rising edge of the external clock CLK in order to apply the electrical stress to the entire device.

However, in the ordinary SDRAM as stated above, the activated period and precharging period of a word line will be iteratively repeated in an alternate manner for each cycle of the external clock CLK. Thus the period of time in which the electrical stress is applied to the device after activation of the word line will be one half of the net testing period. This indicates that a test that can apply the electrical stress more effective than this percentage is not achievable and that any attempts to further saving time of test may fail.

In addition, the next generation SDRAM as described above is required to operate at the external clock CLK of high frequency, on the demand of accelerated operation. The given time t1 to be measured by the internal timer circuit 300 will then be set to a shorter period of time appropriate to the power of data accessing operation. In the burn-in stress test on the other hand, the maximum performance may not be achieved by the limitation in the testing environment and the like, thus in general the synchronous semiconductor device has enough margins to operate with respect to the frequency of the external clock CLK used in the test. This concludes that the electrical stress may not effectively applied because of the small duty rate in the given time t1 that the word lines are activated.

SUMMARY OF THE INVENTION

The present invention has been made in view of the above circumstances and has an object to effectively perform the burn-in stress test and to provide a synchronous semiconductor device having a higher efficiency for applying electrical stress to the devices and an inspection system thereof.

In order to achieve the above object, the synchronous semiconductor device in accordance with a first aspect of the present invention, which iteratively repeats the alternate transits between an activated state and an inactivated state for performing a test in the activated state, comprises, a latch unit for latching a synchronous activating signal in synchronism with a first synchronizing timing of a synchronizing signal; an inactivating signal detector unit for detecting an inactivating signal a predetermined period of time before the activated state, and an inactivating unit for commanding an inactivated state based on the inactivating signal thus detected.

The synchronous semiconductor device may use the inactivating signal detector unit to detect the inactivating signal a predetermined period of time before going to an activated state, at the time when performing a test in the activated state while iteratively repeating the transit of operating states between activated and inactivated states in an alternate manner to command by the inactivating unit to go to inactivated state prior to latching by the latch unit the synchronous activating signal in synchronism with the first synchronizing timing of the synchronizing signal in order to go to the activated state.

The inactivated state may be thereby configured a predetermined period of time before the first synchronizing timing of the synchronizing signal to go to the activated state. The duration of the activated state during the test may be arbitrarily set by using the synchronous activating signal that synchronizes with the synchronizing signal in the normal operation of the synchronous semiconductor device. Therefore the activated state needed during the test may be effectively configured. The testing period may be shortened by increasing the rate of duration of the activated state.

A synchronous semiconductor device in accordance with a second aspect of the present invention, which alternately transits between an activated state and an inactivated state in an iterative manner for performing a test in the activated state, comprises, a latch unit for latching a synchronous inactivating signal in synchronism with a first synchronizing timing of a synchronizing signal; an activating signal detector unit for detecting an activating signal a predetermined period of time after the inactivated state, and an activating unit for commanding an activated state based on the activating signal thus detected.

The synchronous semiconductor device as stated above may use the latch unit to latch the synchronous inactivating signal in synchronism with the first synchronizing timing of the synchronizing signal to go to the inactivated state at the time when performing a test in the activated state while iteratively repeating the operating states between activated and inactivated states in an alternate manner, then, may use, after a predetermined period of time, the activating signal detecting unit to detect the activating signal to go to the activated state.

The activated state may be thereby configured a predetermined period of time after the first synchronizing timing of the synchronizing signal to go to the inactivated state. The duration of the activated state during the test may be arbitrarily set by using the synchronous inactivating signal that synchronizes with the synchronizing signal in the normal operation of the synchronous semiconductor device. Therefore the activated state needed during the test may be effectively configured. The testing period may be shortened by increasing the rate of duration of the activated state.

An inspection system for the synchronous semiconductor device in accordance with a third aspect of the present invention, which iteratively repeats the transits between an activated state and an inactivated state in an alternate manner for performing a test in the activated state, comprises, a synchronization signal supplying unit for supplying a synchronization signal to a synchronous semiconductor device; a synchronous activating signal supplying unit for supplying a synchronous activating signal in synchronism with the first synchronizing timing of the synchronization signal; and an inactivating signal supplying unit for supplying an inactivating signal a predetermined period of time before an activated state.

The inspection system of the synchronous semiconductor device in accordance with the present invention may use the synchronization signal supplying unit to supply the synchronization signal and use the inactivating signal supplying unit to supply the inactivating signal a predetermined period of time before an activated state, at the time when performing a test in the activated state while iteratively repeating the transit of operating states between activated and inactivated states in an alternate manner. Thereafter the system may use the synchronous activating signal supplying unit to supply the synchronous activating signal in synchronism with the first synchronizing timing of the synchronization signal.

The inactivating signal may be supplied thereby a predetermined period of time before the first synchronizing timing of the synchronization signal to go to the activated state, so that the duration of the activated state of the synchronous semiconductor device during the test may be arbitrarily configured while supplying the synchronization signal as well as the synchronization activating signal for synchronizing therewith in the normal operation of the synchronous semiconductor device. Therefore an inspection system may be provided in which the activated state needed during the test may be effectively configured and the testing period may be shortened by increasing the rate of duration of the activated state.

An inspection system for the synchronous semiconductor device in accordance with a fourth aspect of the present invention, which iteratively repeats the transits between an activated state and an inactivated state in an alternate manner for performing a test in the activated state, comprises, a synchronization signal supplying unit for supplying a synchronization signal to a synchronous semiconductor device; a synchronous inactivating signal supplying unit for supplying a synchronous inactivating signal in synchronism with the first synchronizing timing of the synchronization signal; and an activating signal supplying unit for supplying an activating signal a predetermined period of time after an inactivated state.

The inspection system of the synchronous semiconductor device in accordance with the present invention may use the synchronization signal supplying unit to supply the synchronization signal and use the synchronous inactivating signal supplying unit to supply the synchronization inactivating signal in synchronism with the first synchronizing timing of the synchronization signal, at the time when performing a test in the activated state while iteratively repeating the transit of operating states between activated and inactivated states in an alternate manner. After a predetermined period of time, the system may use the activating signal supplying unit to supply the activating signal.

The activating signal may be supplied thereby a predetermined period of time after the first synchronizing timing of the synchronization signal to go to the inactivated state, so that the duration of the activated state of the synchronous semiconductor device during the test may be arbitrarily configured while supplying the synchronization signal as well as the synchronization inactivating signal for synchronizing therewith in the normal operation of the synchronous semiconductor device. Therefore an inspection system may be provided in which the activated state needed during the test may be effectively configured and the testing period may be shortened by increasing the rate of duration of the activated state.

An inspection method in accordance with a fifth aspect of the present invention for inspecting the synchronous semiconductor device, which iteratively repeats the transits between an activated state and an inactivated state in an alternate manner for performing a test in the activated state, comprises the steps of a predetermined period of time prior to going to the activated state, detecting an inactivating signal; transiting to the inactivated state; latching thereafter a synchronization activating signal in synchronism with the first synchronizing timing of a synchronization signal to go to an activated state.

In accordance with the inspection method of the synchronous semiconductor device, which iteratively repeats the alternate transits between an activated state and an inactivated state for performing a test in the activated state, which device transits to the inactivated state by an inactivating signal a predetermined period of time before going to an activated state and then latches a synchronization activating signal in synchronism with the first synchronization timing of the synchronization signal to go to the activated state, the timing of the inactivating signal may be arbitrarily configured so that the testing period may be shortened by increasing the rate of duration of the activated state while making use of the synchronization activating signal in synchronism with the synchronization signal in the normal operation of the synchronous semiconductor device.

An inspection method in accordance with a sixth aspect of the present invention for inspecting the synchronous semiconductor device, which iteratively repeats the transits between an activated state and an inactivated state in an alternate manner for performing a test in the activated state, comprises the steps of: latching a synchronization inactivating signal in synchronism with the first synchronizing timing of a synchronization signal to transit to an inactivated state; and a predetermined period of time after the inactivated state, detecting an activating signal to go to the activated state.

In accordance with the inspecting method of the synchronous semiconductor device, which device transits to the activated state by an activating signal a predetermined period of time after transiting to the inactivated state by an synchronization inactivating signal in synchronism with the first synchronization timing of the synchronization signal at the time when performing a test in the activated state while iteratively repeating the transit of operating states between activated and inactivated states in an alternate manner, the timing of the activating signal may be arbitrarily configured so that the testing period may be shortened by increasing the rate of duration of the activated state while making use of the synchronization inactivating signal in synchronism with the synchronization signal in the normal operation of the synchronous semiconductor device.

The above and further objects and novel features of the invention will more fully appear from following detailed description when the same is read in connection with the accompanying drawings. It is to be expressly understood, however, that the drawings are purpose of illustration only and not intended as a definition of the limits of the invention.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention. In the drawings.

DETAILED DESCRIPTION OF THE PREFERRED EMBODIMENTS

A detailed description of first through third preferred embodiments embodying the synchronous semiconductor device and the inspection method of synchronous semiconductor device in accordance with the present invention will now be given in greater details referring to the accompanying drawings.

Figure 2:
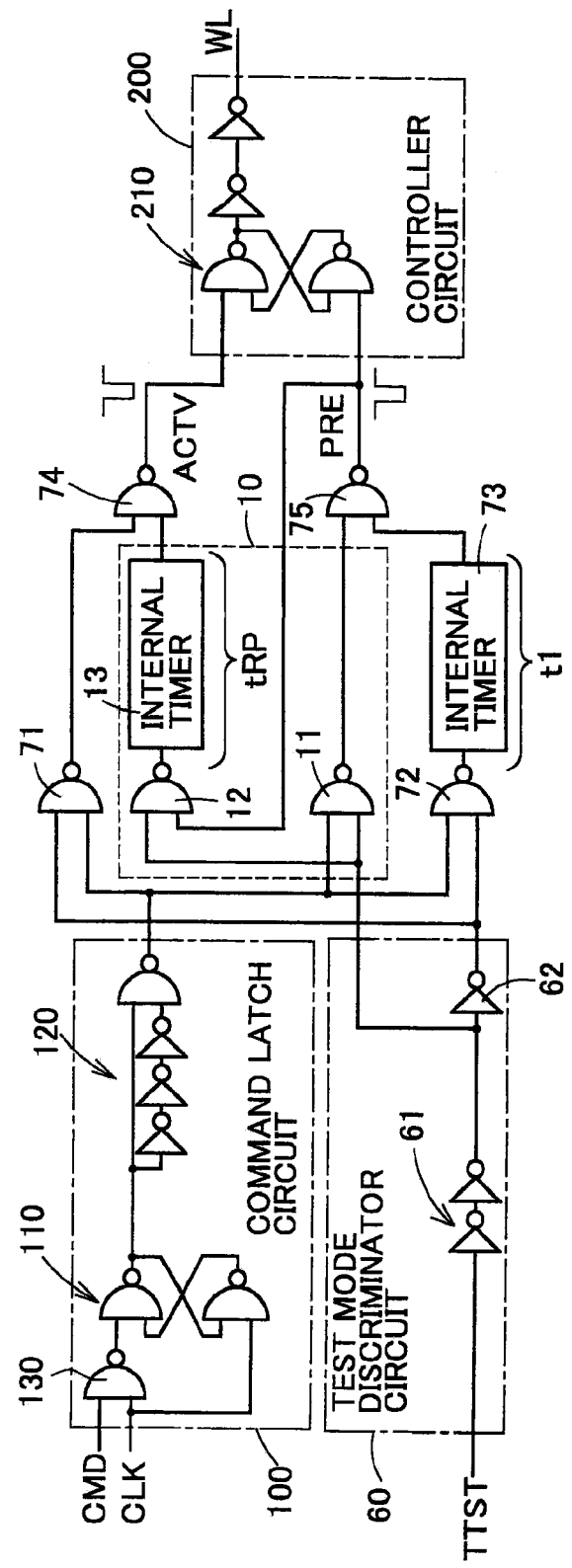
FIG. 2 is a schematic circuit diagram depicting a controller circuit of word lines in accordance with the first preferred embodiment of the present invention.
Figure 3:
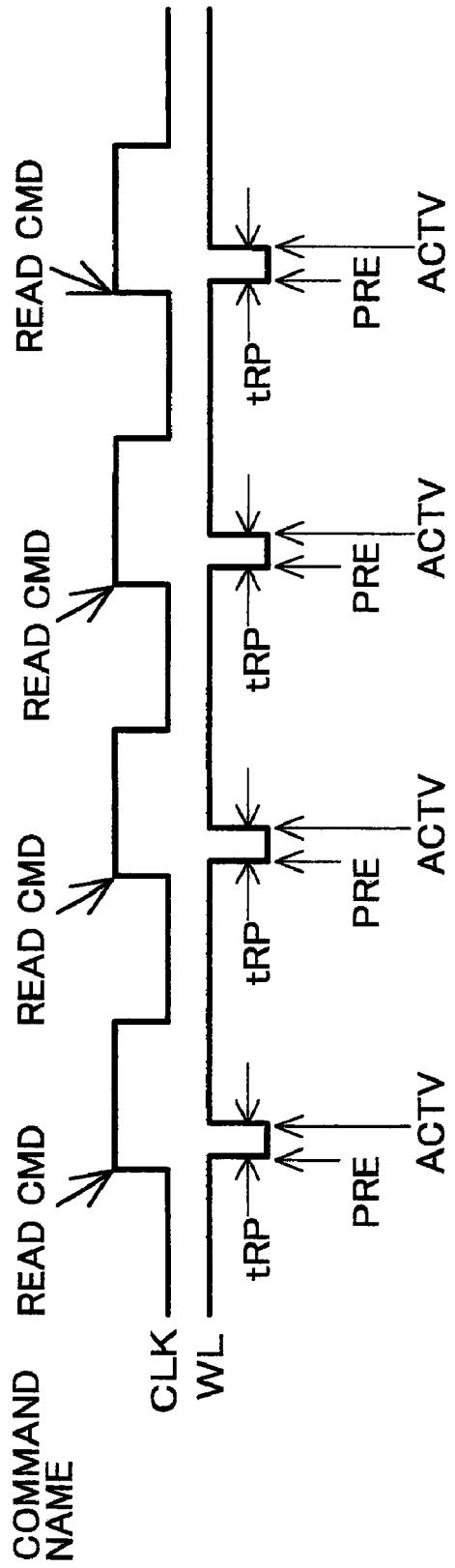
FIG. 3 is a schematic waveform diagram illustrating the operating waveforms in accordance with the first preferred embodiment of the present invention.
Figure 4:
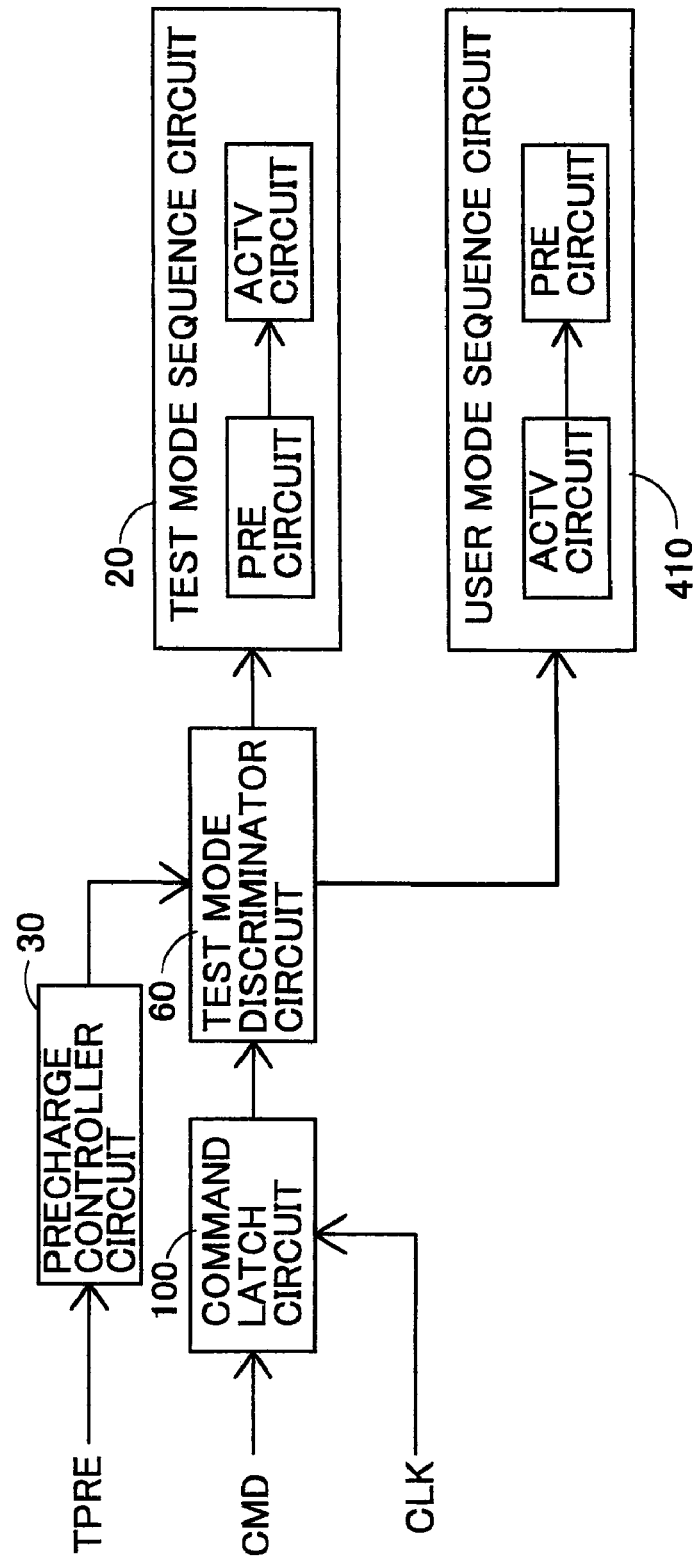
FIG. 4 is a schematic block diagram of a circuit in accordance with second preferred embodiment of the present invention.
Figure 5:
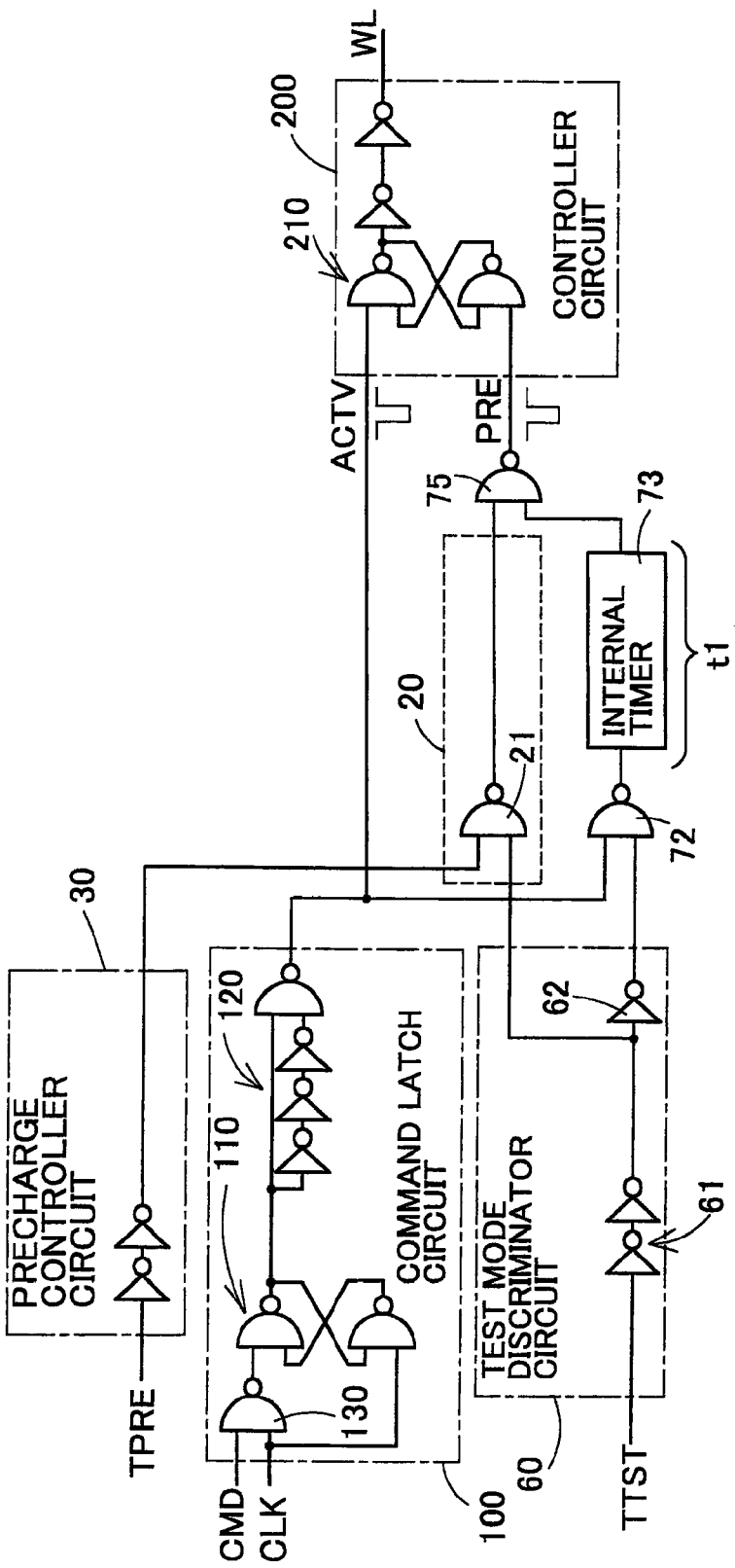
FIG. 5 is a schematic circuit diagram depicting a controller circuit of word lines in accordance with the second preferred embodiment of the present invention.
Figure 6:
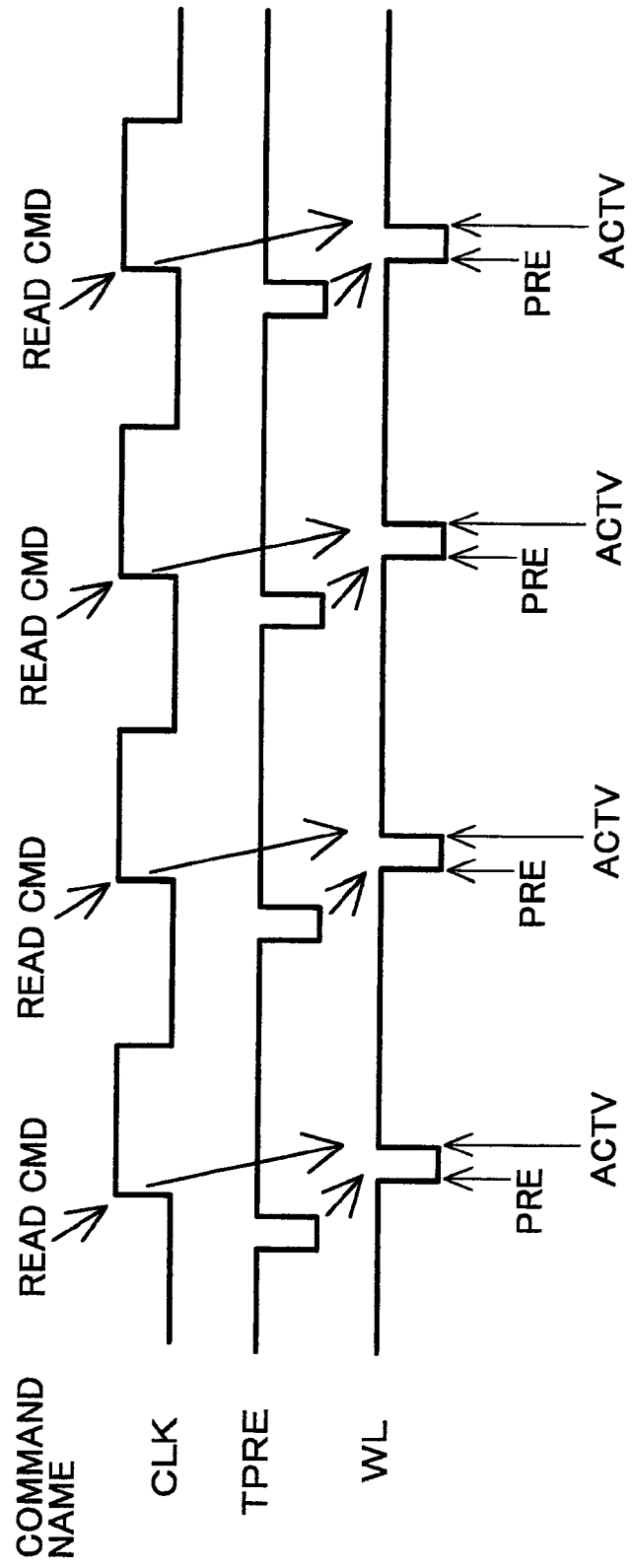
FIG. 6 is a schematic waveform diagram illustrating the operating waveforms in accordance with the second preferred embodiment of the present invention.
Figure 7:
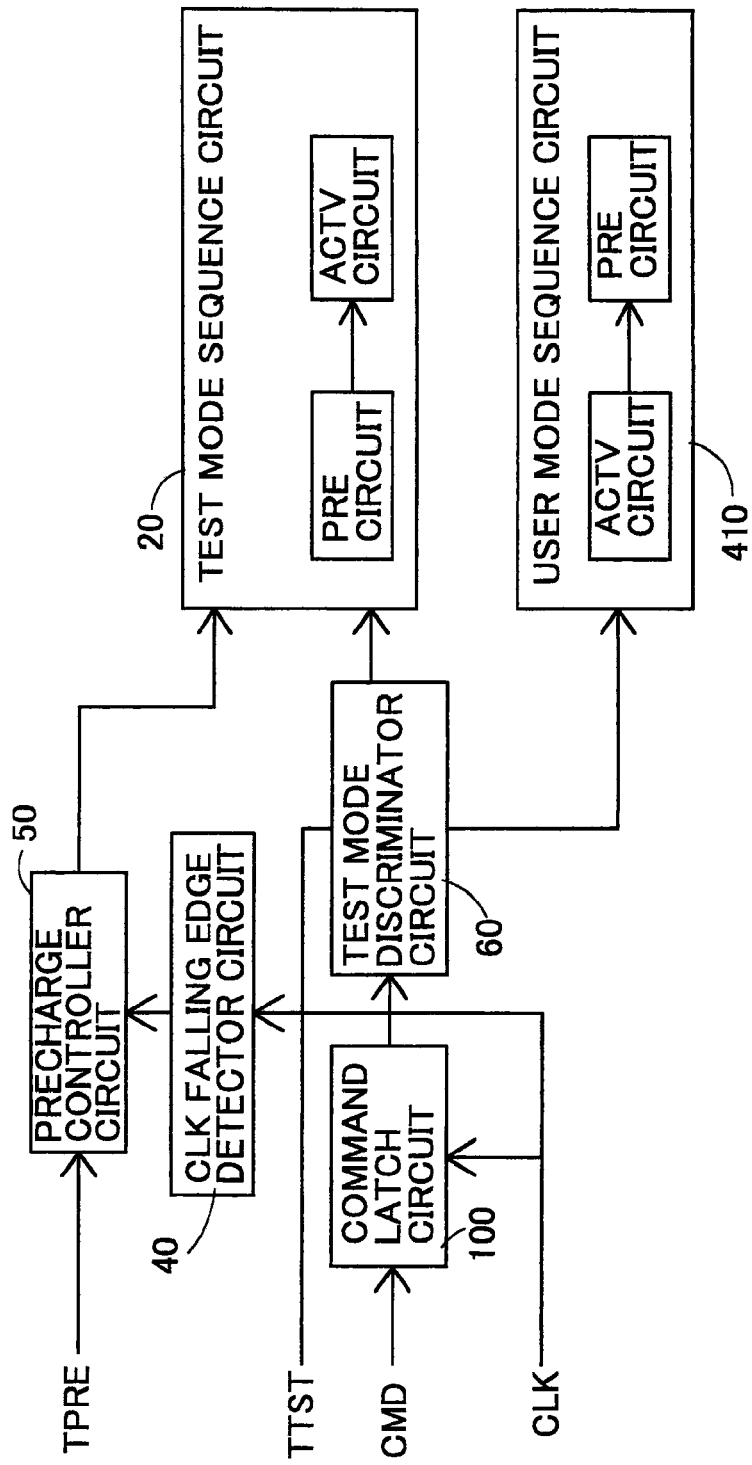
FIG. 7 is a schematic block diagram of a circuit in accordance with third preferred embodiment of the present invention.
Figure 8:
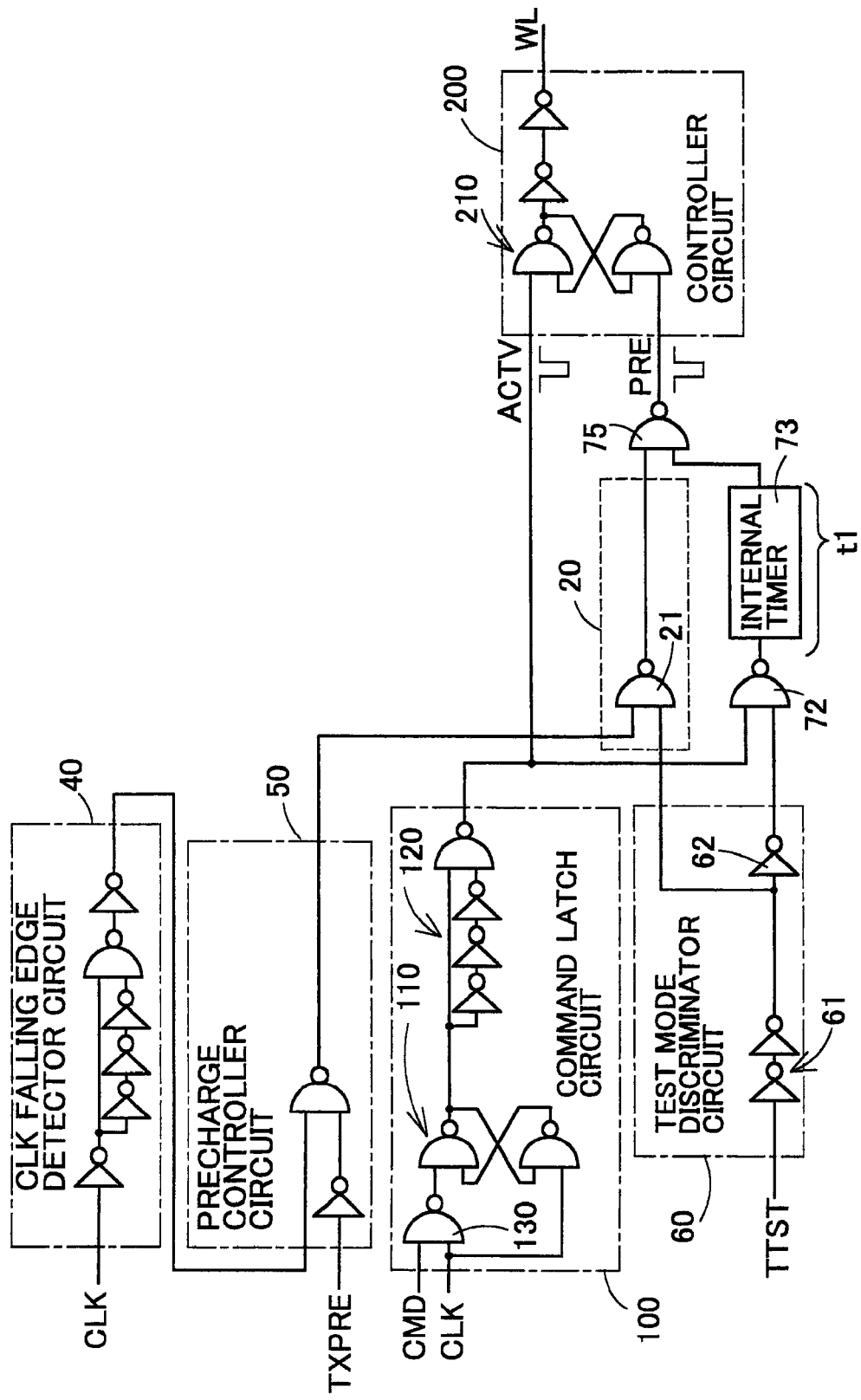
FIG. 8 is a schematic circuit diagram depicting a controller circuit of word lines in accordance with the third preferred embodiment of the present invention.
Figure 9:
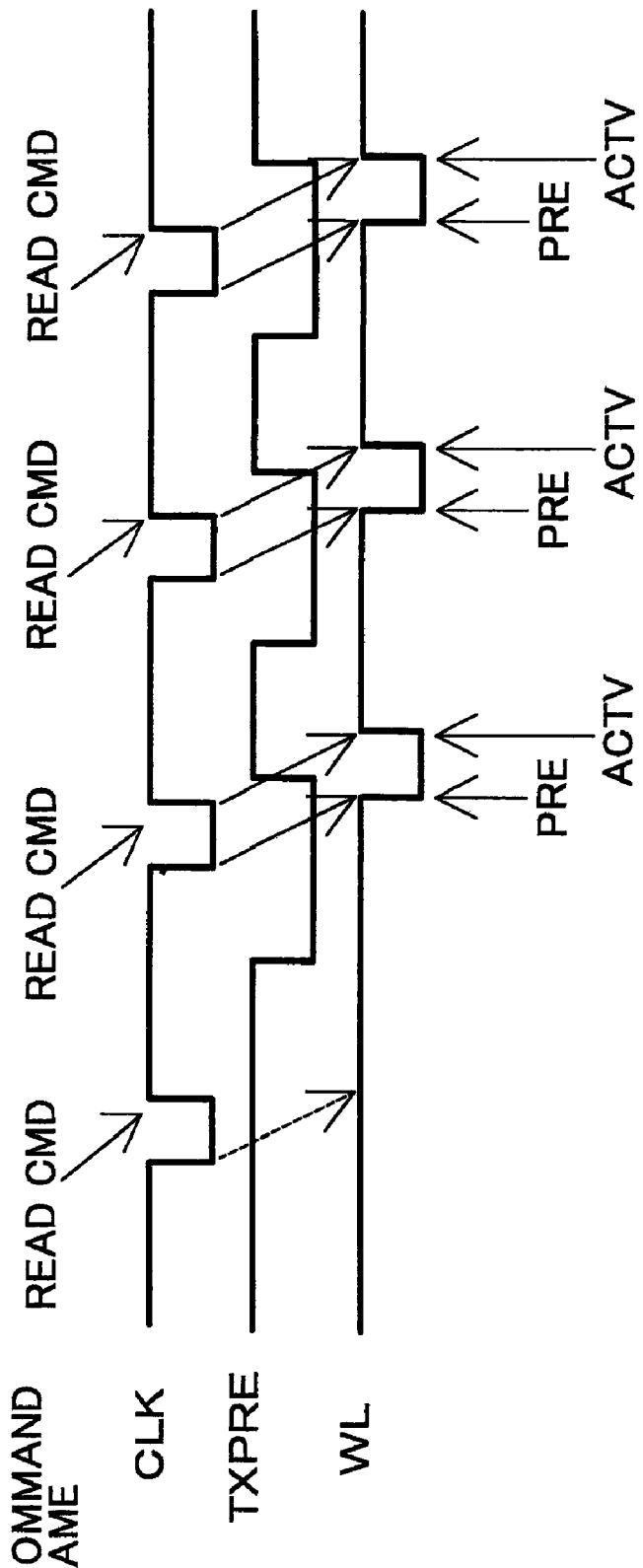
FIG. 9 is a schematic waveform diagram illustrating the operating waveforms in accordance with the third preferred embodiment of the present invention.
Figure 10:
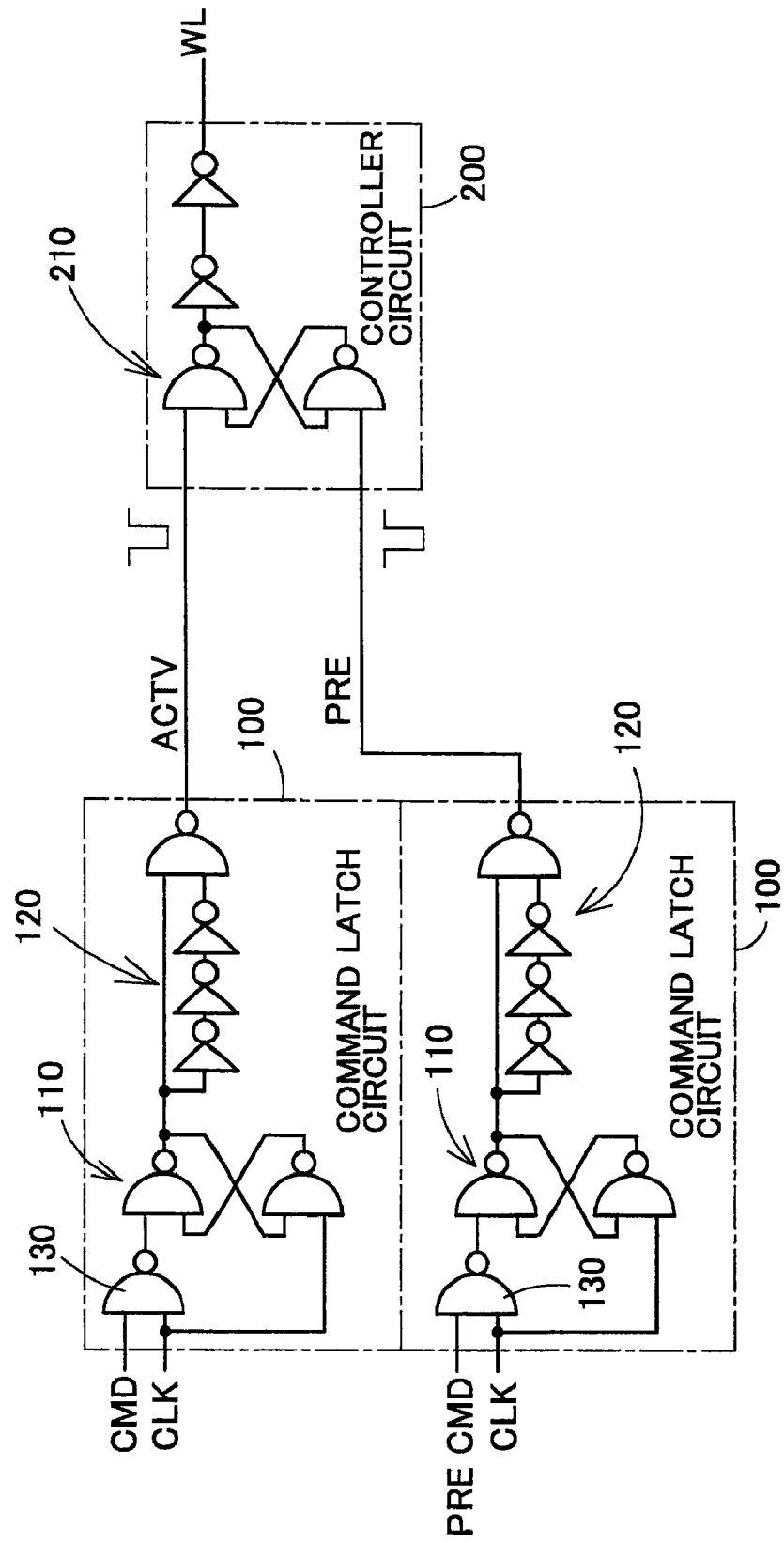
FIG. 10 is a schematic circuit diagram depicting a controller circuit of word lines in accordance with a Prior Art.
Figure 11:
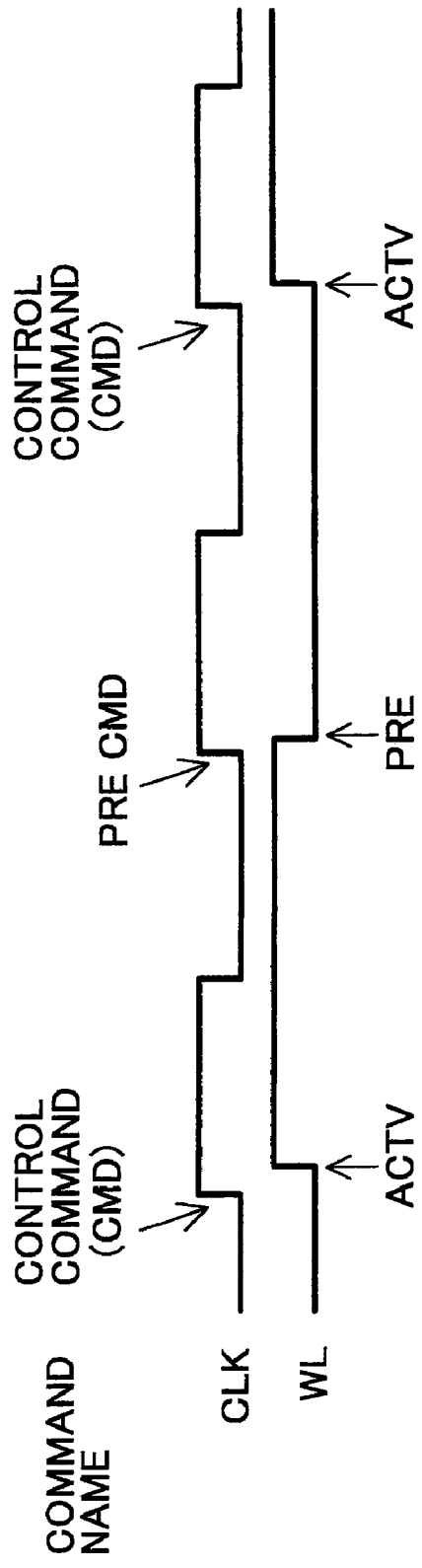
FIG. 11 is a schematic waveform diagram illustrating the operating waveforms in accordance with the Prior Art.
Figure 12:
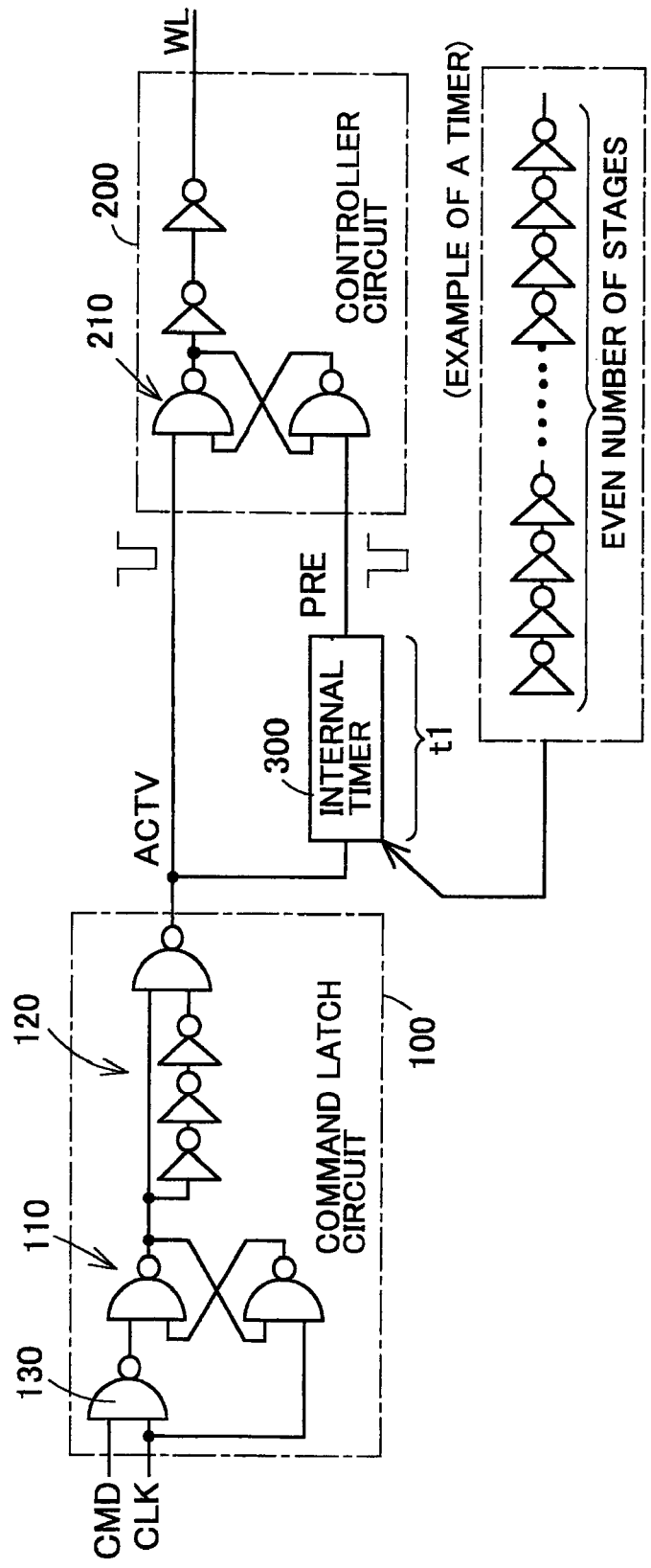
FIG. 12 is another schematic circuit diagram depicting a controller circuit of word lines in accordance with another Prior Art.
Figure 13:
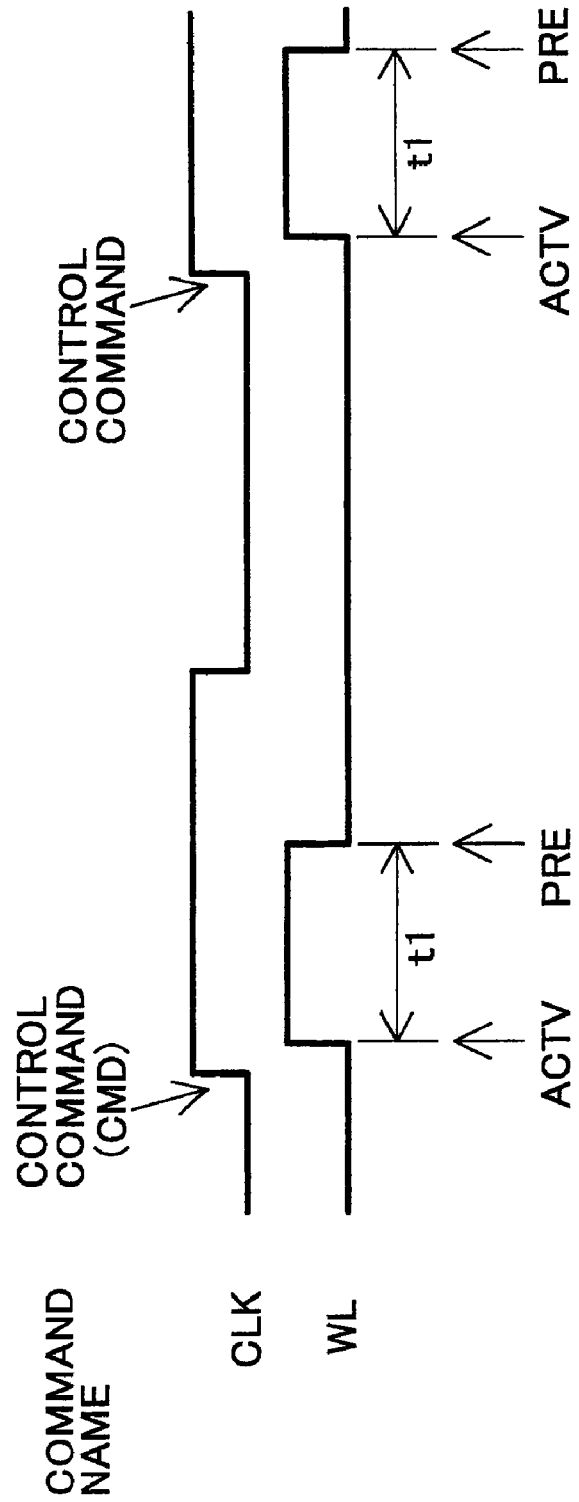
FIG. 13 is another schematic waveform diagram illustrating the operating waveforms in accordance with another Prior Art.

In the preferred embodiments disclosed herein, the detailed description will be given by way of example in case in which a next generation SDRAM that executes a series of data access operations by one command input is subject to a burn-in stress test. Now referring to FIG. 1, there is shown a schematic block diagram of a circuitry in accordance with first preferred embodiment. FIG. 2 shows a schematic circuit diagram depicting a controller circuit of word lines in accordance with the first preferred embodiment. FIG. 3 is a schematic waveform diagram illustrating the operating waveforms in accordance with the first preferred embodiment. FIG. 4 is a schematic block diagram of a circuit in accordance with second preferred embodiment. FIG. 5 is a schematic circuit diagram depicting a controller circuit of word lines in accordance with the second preferred embodiment. FIG. 6 is a schematic waveform diagram illustrating the operating waveforms in accordance with the second preferred embodiment. FIG. 7 is a schematic block diagram of a circuit in accordance with third preferred embodiment. FIG. 8 is a schematic circuit diagram depicting a controller circuit of word lines in accordance with the third preferred embodiment. FIG. 9 is a schematic waveform diagram illustrating the operating waveforms in accordance with the third preferred embodiment. The similar members to those used in the Prior Art are designated to the identical reference numbers and the detailed description of the parts will be omitted.

Figure 1:
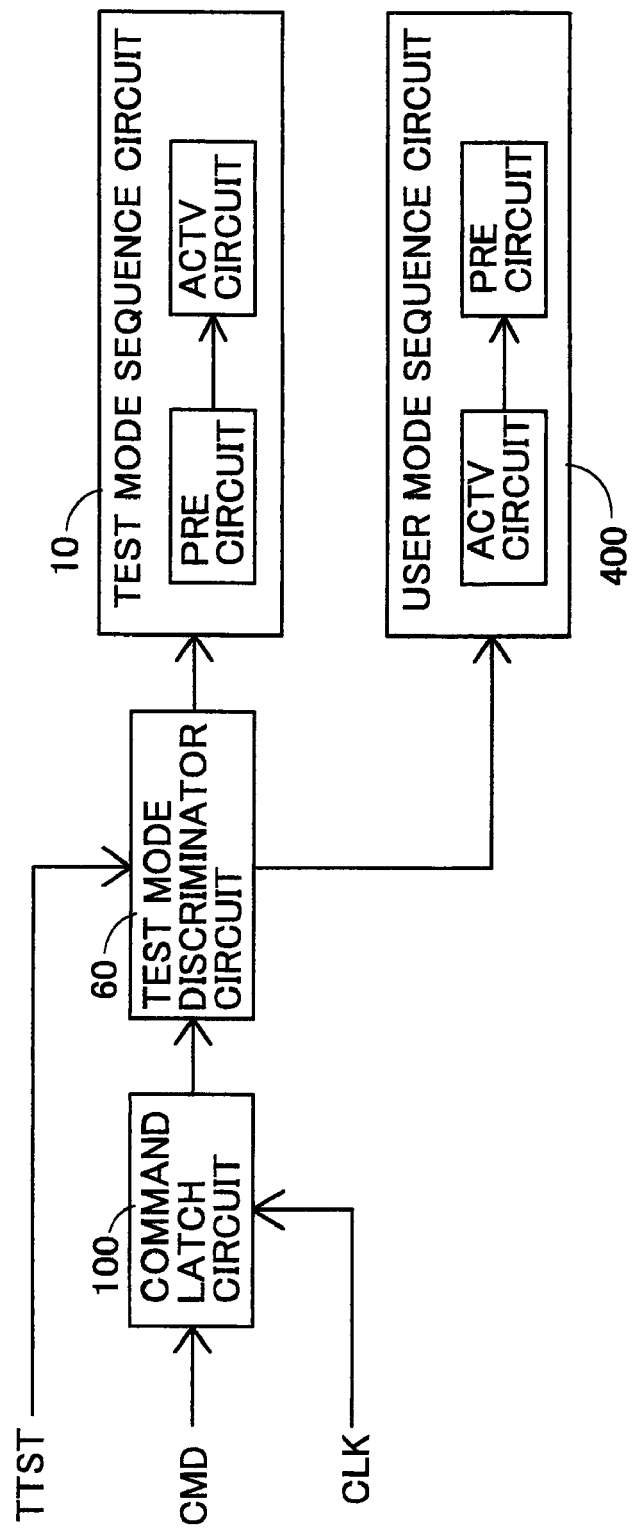
FIG. 1 is a schematic block diagram of a circuit in accordance with first preferred embodiment of the present invention.

In the circuit block diagram of first preferred embodiment shown in FIG. 1 includes two groups of circuits, namely, a test mode sequence circuit 10 and a user mode sequence circuit 400, as the circuits for performing accessing operation in one cycle composed of an activated state and an inactivated state, in the next generation SDRAM. The term "activated" state indicates a period in which a word line applied with a raised voltage for accessing the memory cell is input to the gate of switching MOS transistor in the memory cell, and that the field in the oxide of the gate is subject to the most severe electrical stress in the SDRAM. The term "inactivated" state indicates a period in which bit lines after memory access is precharged and that the configuration of selected word line is performed by changing row address for use in the next activated state.

The two groups of circuits including the test mode sequence circuit 10 and the user mode sequence circuit 400 are those operating the access in the normal use as well as in the burn-in stress test. In the next generation SDRAM, the user mode sequence circuit 400 has to operate with a cycling time of tenths nanoseconds in order to achieve a high-speed access in the normal use. On the other hand, because of limitations in the burn-in stress test, which will be conducted under a raised temperature along with a number of synchronous semiconductor devices to be tested at the same time, it is not possible to reduce the cycling time in the test mode sequence circuit 10.

Thus, in the user mode sequence circuit 400 the ACTV circuit required for the access operation will be served in advance, followed by a PRE circuit that precharges after the completion of access so as to reduce the duration of cycling time. In the test mode sequence circuit 10, in contrast, since the rate of the duration of active state needs to be extended for performing an effective burn-in stress test, the PRE circuit that precharges in the minimum inactivated state necessary will be operated prior to the ACTV circuit that performs an access in the activated state.

Switching between the test mode sequence circuit 10 and the user mode sequence circuit 400 will be performed by a test mode discriminator circuit 60 to which a test mode input signal TTST is fed. Based on the configuration set in the test mode discriminator circuit 60, the test mode sequence circuit 10 or the user mode sequence circuit 400 will be operated in correspondence with the control command CMD latched in the command latch circuit 100 in synchronism with the external clock CLK. In this context the control command CMD may be the own signal input through an external terminal or a command converted by an circuit such as internal command decoder from the signal input from one or more of external terminals.

In the typical example of word line controller circuit as shown in FIG. 2 in accordance with the present embodiment, the test mode sequence circuit 10 includes two NAND gates 11 and 12, and an internal timer 13 to which the output signals from the NAND gate 12 will be supplied. The user mode sequence circuit 400 in a similar way includes two NAND gates 71 and 72, and an internal timer 73 to which the output signals of the NAND gate 72 will be fed. The output signals from the test mode sequence circuit 10 and the user mode sequence circuit 400 will be reassembled in respective NAND gates 74 and 75 for each of active signals and precharge signals. The output signal of the NAND gate 74 will be used as the internal active signal ACTV and the output signal of the NAND gate 75 will be used as the internal precharge signal PRE, both signals being input to the controller circuit 200 in the next stage to set and reset the word line activating signal WL.

A signal in phase with the test mode input signal TTST, output from a buffer 61 of the test mode discriminator circuit 60, will be input to the NAND gates 11 and 12 to operate the test mode sequence circuit 10 in the burn-in stress test. On the other hand, a signal opposite phase with the test mode input signal TTST, output through the inverter 62 of the test mode discriminator circuit 60, will be input to the NAND gates 71 and 72 to operate the user mode sequence circuit 400 in case of normal operation. In addition, a low-level pulse signal on the basis of the control command CMD latched in synchronism with the external clock CLK at the command latch circuit 100 will be input to the NAND gates 11, 71 and 72. To the NAND gate 12 input is the internal precharge signal PRE.

The operation of the controller circuit shown in FIG. 2 will be described now with reference to the operational waveforms shown in FIG. 3, which illustrates the waveforms in the burn-in stress test, or in other words the waveform when the test mode sequence circuit 10 is in service. When an accessing command READ_CMD is supplied to the command latch circuit 100 as a control command CMD, the command latch circuit 100 then will output a low-level pulse in synchronism with the external clock CLK. This low-level pulse signal, which will be fed to the NAND gates 11, 71 and 72, will be accepted only by the NAND gate 11 of the test mode sequence circuit 10 because the test mode input signal TTST is active (i.e., high-level). The low-level pulse will be inverted in the NAND gate 11 to a high-level pulse to be input to the NAND gate 75. The output signal of the inverter 62 in the test mode discriminator circuit 60 is set to low-level so that both the output signal from the NAND gate 72 and the output level from the internal timer 73 will be fixed to high. The NAND gate 75 then will output a low-level internal precharge signal PRE by inverting a high-level pulse to reset the word line activating signal WL through the controller circuit 200.

At the same time the internal precharge signal PRE will also be input to the NAND gate 12, which will produce a high-level signal as output. This high-level signal, which will be subjected to be delayed for tRP by the internal timer 13, will be input to the NAND gate 74. The other input signal fed to the NAND gate is high-level, so that the output signal from the NAND gate 74 will be flipped to low-level. More specifically, The gate will output an internal active signal ACTV to reset the word line activating signal WL through the controller circuit 200. By appropriately configuring the working time tRP of the internal timer 13 a word line can be activated after a minimum precharge period necessary, so that the electrical stress may be applied at the maximum rate of time in a burn-in stress test. Therefore a more effective burn-in stress test may be carried out.

A predetermined period of time after a resetting interval of the word line activating signal WL in an inactive state by the accessing command READ_CMD supplied as a control command CMD, a signal for setting a word line activating interval, which indicates the active state, can be generated on the basis of the accessing command READ_CMD or the signal itself in an synchronous semiconductor device, the next generation SDRAM. The input accessing command READ_CMD synchronized to the external clock CLK in the normal operation of the next generation SDRAM allows the word line activating period in the burn-in stress test to be set to a predetermined period of time, in particular the word line activated period required in the burn-in stress test to be set in a manner more effective than ever. An increased rate of duration of the word line activating period may therefore lead to a shorter time of test.

If the accessing command READ_CMD, which activates the word line in the normal operation is input in a burn-in stress test, a reset interval of the word line activating signal WL will be placed for a predetermined period of time prior to the activation of the word line. That is, it may be sufficient to feed an accessing command READ_CMD in a burn-in stress test in a way identical to that in the normal operation, allowing the control signals to be common in the test as well as in the normal operation, resulting in a simpler handling in the burn-in stress test. The fact that there will not be a specific control signal to be input only in the burn-in stress test will eliminate the necessity of a circuit dedicated for a test and of proprietary external terminals for the test, allowing a minimal overhead of the test in the next generation SDRAM.

It is to be noted here that the command latch circuit 100 is a latch unit according to the second aspect, the internal timer 13 is an activation detector unit according to the second aspect, or a delay unit according to the fifth aspect, the NAND gate 74 is an activating unit according to the second aspect. Also, the external clock CLK is a synchronization signal according to the second aspect, the rising edge of the signal CLK is a first synchronization timing according to the second aspect. In addition, the accessing command READ_CMD used as a control command CMD is a synchronization inactivating signal according to the second aspect, or a synchronization activation signal in the normal operation according to the sixth aspect. The output signal from the NAND gate 12 is an activating signal according to the second aspect, or an input signal to the delay unit according to fifth aspect.

In the normal operation, the test mode input signal TTST is low-level and inactive so that the low-level pulse based on the accessing command READ_CMD will be accepted by the user mode sequence circuit 400. In other words, the NAND gate 71 having a low-level pulse supplied will output a high-level pulse to output an internal active signal ACTV through the NAND gate 74 in order to set the word line activating signal WL. On the other hand, as the low-level pulse will be similarly input to the NAND gate 72 at the same time, a high-level pulse will be appeared at the output of the NAND gate 72, which pulse will be delayed for an interval t1 by the internal timer 73 to output an internal precharge signal PRE to reset the word line activating signal WL. Since the interval t1 will be measured in the device, only one accessing command READ_CMD may invoke a complete operation for one cycle.

Now second preferred embodiment of the present invention will be described in greater details herein below. In the schematic block diagram of circuit shown in FIG. 4, the command latch circuit 100, test mode discriminator circuit 60, and user mode sequence circuit 410 will have the same structure as the circuits described in the preceding first preferred embodiment. In the second embodiment, a precharge controller circuit 30 is added thereto for inputting a precharge control signal TPRE in a burn-in stress test to a test mode sequence circuit 20 to invoke a precharging operation.

A typical example of word line controller circuit in accordance with the second preferred embodiment in FIG. 5 includes a test mode sequence circuit 20 comprised of only one NAND gate 21. The user mode sequence circuit 410 is composed of one NAND gate 72 and a internal timer 73 to input the output signals from the NAND gate 72. The output signals form the test mode sequence circuit 20 and the user mode sequence circuit 410 will be gathered in the NAND gate 75 for the precharging signals and will be input to the controller circuit 200 as an internal precharge signal PRE. Here, with regard to the activating signal, the output signal of the command latch circuit 100 will be input directly to the controller circuit 200 as the internal active signal ACTV.

The signal output from the buffer 61 of the test mode discriminator circuit 60 will be input to the NAND gate 21 as a signal in phase to the test mode input signal TTST in order to operate the test mode sequence circuit 20 in the burn-in stress test. The signal output from the inverter 62 of the test mode discriminator circuit 60 will be fed to the NAND gate 72 opposite phase to the test mode input signal TTST to operate the user mode sequence circuit 410 in the normal operation. In addition, the output signal of the command latch circuit 100, which is a low-level pulse signal based on a control command CMD, will be input to the controller circuit 200 directly as an internal active signal ACTV, as well as to the NAND gate 72 at the same time. To the NAND gate 21 input is the precharge control signal TPRE through the precharge controller circuit 30.

The operation of the controller circuit shown in FIG. 5 will be described by referring to waveforms shown in FIG. 6. FIG. 6 shows waveforms in the burn-in stress test, i.e., those when the test mode sequence circuit 20 is in operation. The precharge control signal TPRE, a low-level pulse input prior to an accessing command READ_CMD as the control command CMD, will pass through the NAND gate 21 and NAND gate 75 to generate an internal precharge signal PRE to reset the word line activating signal WL through the controller circuit 200.

The accessing command READ_CMD in synchronism with an external clock CLK will be input to the command latch circuit 100 at a predetermined delayed time after a precharge control signal TPRE. The command will be forward to the controller circuit 200 as a low-level pulse signal indicating the internal active signal ACTV to set the word line activating signal WL.

More specifically, if the precharge control signal TPRE is set to be advanced a predetermined and appropriate period of time with respect to the external clock CLK served for a synchronization signal of the accessing command READ_CMD, the resetting period of time of the word line activating signal WL by the internal precharge signal PRE passing through the controller circuit 200 may be served as the minimum precharging period necessary, while the period which follows may be served for the word line activating period, allowing the electrical stress in a burn-in stress test to be applied at a maximum rate of duration to achieve a more efficient burn-in stress test.

The reset interval of the word line activating signal WL in inactive state may be set at an arbitrary timing by the precharge control signal TPRE in response to the external input signal from the proprietary external terminal or an existing external terminal. That is, a resetting interval of the word line activating signal WL may be configured at an arbitrarily predetermined period of time prior to a raising edge of the external clock CLK which forces to a word line activating period, the active stage. While making use of the synchronization activating signal in synchronism with the external clock CLK in the normal operation of a synchronous semiconductor device that is the next generation SDRAM, the word line activating period in the test may be arbitrarily set, allowing the word line activating period required in the burn-in stress test to be configured in an effective way. This may increase the rate of duration of the word line activation so as to shorten the period of the test. In addition, the input timing of the precharge control signal TPRE may be readily adjusted for each test or during a test in an arbitrary manner so as to always optimize the test efficiency.

Here it is to be noted that the command latch circuit 100 is a latch unit according to the first aspect, the precharge controller circuit 30 and the NAND gate 21 are inactivating detector unit according to the first aspect, the NAND gate 75 is an inactivating unit according to the first aspect. Also the external clock CLK is a synchronization signal in the first aspect, the rising edge thereof is the first synchronization timing according to the first aspect. Furthermore, the accessing command READ_CMD served as a control command CMD is the synchronization activating signal according to the first aspect. The precharge control signal TPRE is an inactivating signal in the first aspect, or a first asynchronous control signal from the external source.

In the normal operation, the test mode input signal TTST is low-level, and inactivated, so that the output of the NAND gate 21 of the test mode sequence circuit 20 will be set to high-level, as a result the low-level pulse following the accessing command READ_CMD will be accepted by the user mode sequence circuit 410. In other words, the low-level pulse will be served as an internal active signal ACTV to directly set the word line activating signal WL. The pulse will be also input to the NAND gate 72 at the same time, the output signal of the NAND gate 72 which will be a high-level pulse will be delayed for t1 by the internal timer 73 to output an internal precharge signal PRE to reset the word line activating signal WL. Since the interval t1 will be measured in the device, only one accessing command READ_CMD may invoke a complete operation for one cycle.

Now a third preferred embodiment of the present invention will be described in greater details herein below. The command latch circuit 100, test mode discriminator circuit 60, user mode sequence circuit 410, and test mode sequence circuit 20 in the schematic block diagram of circuitry of FIG. 7 are identical to those described in the foregoing second preferred embodiment of the present invention. In the present third embodiment, a CLK falling edge detector circuit 40 and a precharging controller circuit 50 are incorporated instead of the precharge controller circuit 30 for inputting a precharging control signal TXPRE in synchronism with a falling edge of the external clock CLK to the test mode sequence circuit 20 to invoke a precharging operation, in the burn-in stress test.

In a typical example of word line controller circuit in accordance with the third preferred embodiment shown in FIG. 8, in a similar manner to the foregoing second embodiment, the output signal of the buffer 61 of the test mode discriminator circuit 60 will be input to the NAND gate 21 to operate the test mode sequence circuit 20 in the burn-in stress test. The output signal of the inverter 62 of the test mode discriminator circuit 60 will be input to the NAND gate 72 to operate the user mode sequence circuit 410 in the normal operation. In addition the low-level pulse signal of the command latch circuit 100 will be fed to the controller circuit 200 directly as an internal active signal ACTV as well as to the NAND gate 72. The output signal of the precharging controller circuit 50 will also be input to the NAND gate 21.

The output signal of the precharging controller circuit 50, which is a circuit for accepting the precharging control signal TXPRE in synchronism with the falling edge of the external clock CLK, is the NAND gate output. The inverted signal of the precharging control signal TXPRE and the output signal from the CLK falling edge detector circuit 40 are input signals of the NAND gate. The CLK falling edge detector circuit 40 will synchronize to the falling edge timing of the external clock CLK to output a high-level pulse having a predetermined width (in the example shown in FIG. 8, width of delayed period for three stages of inverter gates). Therefore, if a low-level precharging control signal TXPRE during this high-level pulse is input, the precharging controller circuit 50 will output a low-level pulse.

The operation of the controller circuit shown in FIG. 8 will be described by referring to waveforms shown in FIG. 9. FIG. 9 shows waveforms in the burn-in stress test. The accessing command READ_CMD served for a control command CMD will be input in synchronism with the rising edge of a external clock CLK, while the precharging controller circuit 50, which receives the low-level signal of the precharging control signal TXPRE in synchronism with the falling edge of the immediately preceding external clock CLK, will output an internal precharge signal PRE through the NAND gate 21 and the NAND gate 75 to the controller circuit 200 to reset the word line activating signal WL.

Synchronized to the rising edge of an external clock CLK which follows, the accessing command READ_CMD will be input to the command latch circuit 100 a predetermined period of time after the precharging control signal TXPRE to generate a low-level pulse signal served as an internal active signal ACTV to be fed to the controller circuit 200 to set the word line activating signal WL.

More specifically, since the precharging control signal TXPRE is input in synchronism with the falling edge of an external clock CLK, if the falling edge timing is preceded an appropriately predetermined period of time with respect to the immediately succeeding rising edge of the external clock CLK to synchronize the accessing command READ_CMD, the resetting period of the word line activating signal WL by the controller circuit 200 in response to the internal precharge signal PRE will be configured as the least minimum precharging period, while the period which follows will be served for the word line activating period, allowing the electrical stress when performing a burn-in stress test to be applied at a maximum rate of duration in order to achieve a more efficient burn-in stress test.

The precharging control command TXPRE to be input to the synchronous semiconductor device that is the next generation SDRAM, in response to the external signal input through a proprietary external terminal or an existing external terminal will be supplied in synchronism with the falling edge of the external clock CLK not used in the normal operation. The relationship between the rising edge and the falling edge may be arbitrarily configurable, and the resetting period of the word line activation signal WL in the inactivated state may be set an arbitrary period of time preceding a rising edge of the external clock CLK, which transit a word line activating period in the activated state. The word line activating period in the burn-in stress test may be arbitrarily configured while making use of the synchronization activating signal in synchronism with the external clock CLK in the normal operation of the synchronous semiconductor device, a next generation SDRAM, allowing the word line activating period required in the burn-in stress test to be configured in an effective way. In addition, this may increase the rate of duration of the word line activation so as to shorten the period of the test. Furthermore, the timing of a falling edge with respect to a rising edge of the external clock CLK and the input timing of the precharging control signal TPRE may be readily adjusted for each test or during a test in an arbitrary manner so as to always optimize the test efficiency.

It is to be noted here that the command latch circuit 100 is a latch unit according to the first aspect, the CLK falling edge detector circuit 40, precharging controller circuit 50 and the NAND gate 21 are an inactivating detector unit according to the first aspect, the NAND gate 75 is an inactivating unit according to the first aspect. Also the external clock CLK is a synchronization signal according to the first aspect, the rising edge thereof is a first synchronization timing according to the first aspect. Furthermore, the access command READ_CMD served as a control command CMD is a synchronization activating signal according to the first aspect. The falling edge of the external clock CLK is the second synchronization timing from an external source, the precharging control signal TXPRE is an inactivating signal according to the first aspect, or first synchronization control signal from an external source.

In the normal operation, this preferred embodiment, which may act as similar to the circuit in accordance with the foregoing second embodiment, may measure the timing of t1 in the device, so that only one accessing command READ_CMD may invoke a complete operation for one cycle.

When conducting the burn-in stress test of the synchronous semiconductor device in accordance with first through third preferred embodiments as have been described above, since it is economical and effective to test a number of synchronous semiconductor devices in a test, an circuit board of inspection bench in general is designed to accept a number of same synchronous semiconductor devices. The circuit board is in general housed in an environment test chamber such as a thermostatic chamber due to the requirement of setting an inspection environment including the humidity and the temperature. In this situation a variety of control signals, including commands such as the external clock CLK, control command CMD, and precharging command PRE_CMD, and signals such as the precharge control signals TPRE, TXPRE, the test mode input signal TTST and the like may need to be individually supplied to each of the synchronous semiconductor devices being subject to be tested. In addition, the influence including such as the load of wiring from the signal supplier apparatus to the test chamber and the like should be taken into consideration. Therefore, the inspection system of the synchronous semiconductor device in accordance with first through third preferred embodiments of the present invention may be capable of supplying, at appropriate timings, such commands as the external clock CLK, control command CMD, precharging command PRE_CMD, and the like and such signals as precharge control signal TPRE, precharging control signal TXPRE, test mode input signal TTST and the like. Also the inspection system used may need to be ensured to have drivers capable of feeding signals to each of a number of synchronous semiconductor devices mounted on an inspection circuit board in a positive and secure manner. More particularly, the inspection system needs to have output buffers that can output binary values of high and low with a sufficient output current supply capacity as a driver, or output buffers that can output ternary values having a high impedance state, which system may have the driving level and timings well controlled each other so as to output predetermined control signals based on the frequency of the external clock CLK input and stored in advance, the input timing of the precharge control signal TPRE and TXPRE compatible to the corresponding precharge period, and the duty ratio of the external clock CLK or the command supplied from another configuration unit.

It is to be noted here that the external clock CLK used in first through third preferred embodiments are synchronization signals supplied from a synchronization signal supplier unit according to the third or fourth aspect, the rising edge thereof is first synchronization timing according to either the third or fourth aspect, respectively.

In the first preferred embodiment described above, the accessing command READ_CMD served as a control command CMD is a synchronization inactivating signal supplied from a synchronization inactivating signal supplier unit according to the fourth aspect.

In the second preferred embodiment described above, the accessing command READ_CMD served as a control command CMD is a synchronization activating signal supplied from a synchronization activating signal supplier unit according to the third aspect, while the precharge control signal TPRE is an inactivating signal supplied from an inactivating signal supplier unit according to the third aspect.

In the third preferred embodiment described above, the accessing command READ_CMD served as a control command CMD is a synchronization activating signal supplied from a synchronization activating signal supplier unit according to the third aspect, while the precharging control signal TXPRE is an inactivating signal supplied from an inactivating signal supplier unit according to the third aspect.

As can be appreciated from the above detailed description, in the synchronous semiconductor device in accordance with first preferred embodiment of the present invention, the PRE circuit served for precharging in a least minimum inactivated state will operate, then the ACTV circuit served for accessing in an activated state will operate thereafter, due to the requirement of increasing the rate of duration of the activated state in the test mode sequence circuit 10 in order to conduct an effective burn-in stress test. As the least minimum inactive period in this situation will be achieved by appropriately configuring the measuring time tPR of the internal timer 13, a word line will be activated after a least minimum precharging period required so that the electrical stress may be applied at the maximum rate of time in a burn-in stress test, allowing a more effective burn-in stress test to be carried out.

In the synchronous semiconductor device in accordance with second preferred embodiment of the present invention, by setting the timing of the precharge control signal TPRE an appropriate period of time before the external clock CLK that is a synchronization signal for the accessing command READ_CMD, the resetting period of the word line activating signal WL by the controller circuit 200 in response to the internal precharge signal PRE will be configured as the least minimum precharging period, while the period which follows will be served for the word line activating period, allowing the electrical stress in a burn-in stress test to be applied at a maximum rate of duration to achieve a more efficient burn-in stress test.

Furthermore, in the synchronous semiconductor device in accordance with third preferred embodiment of the present invention, by setting the timing of falling edge of the external clock CLK an appropriate period of time before the next rising edge of the external clock CLK that synchronizes the accessing command READ_CMD since the precharging control signal TXPRE is input in synchronism with the falling edge of the external clock CLK, then the resetting period of the word line activating signal WL by the controller circuit 200 in response to the internal precharge signal PRE will be configured as the least minimum precharging period, while the period which follows will be served for the word line activating period, allowing the electrical stress in a burn-in stress test to be applied at a maximum rate of duration to achieve a more efficient burn-in stress test.

An inspection system for conducting a burn-in stress test of the synchronous semiconductor devices in accordance with the first through third preferred embodiments of the present invention as have been described above may have output buffers that can output binary or ternary values with a sufficient output current supply capacity as a driver, and may have the driving level and timings well controlled each other so as to output predetermined control signals based on the frequency of the external clock CLK input and stored in advance, the input timing of the precharge control signal TPRE and TXPRE compatible to the corresponding precharge period, and the duty ratio of the external clock CLK or the command supplied from another configuration unit.

The present invention may be embodied in other specific forms without departing from the spirit or essential characteristics thereof.

For instance, in the second preferred embodiment, although an exemplary circuit has been described by way of example in which the precharge control signal TPRE may configure the least minimum precharging period necessary, by appropriately setting the input timing of the precharge control signal TPRE, a low-level pulse that is to be input prior to the accessing command READ_CMD that is a control command CMD, the relationship between the activating signal and the precharging signal may be reversed. Namely, the state can be switched to "active" by receiving a precharging command PRE_CMD synchronously with the rising edge timing of the external clock and then an appropriate period of time thereafter by inputting asynchronous activating signal. In the latter case if the interval between a synchronization signal to an asynchronous activating signal is appropriately adjusted, a word line will be activated after a least minimum precharging period required so that the electrical stress may be applied at the maximum rate of time in a burn-in stress test, allowing a more effective burn-in stress test to be carried out. It is to be noted here that the asynchronous activating signal designates to an activating signal according to the second aspect, or a second asynchronous control signal from an external source.

The word line activation period, namely the active state of the word line, may be configured at an arbitrary timing by means of the activating signal in correspondence with a signal external input via a proprietary external terminal or an existing external terminal. Therefore the word line activation period may be set after an arbitrary period of time following a rising edge of the external clock CLK, which transit a word line activating signal WL to the resetting period which is in the inactivated state. The word line activating period in the burn-in stress test may be arbitrarily configured while making use of the precharging command PRE_CMD in synchronism with the external clock CLK in the normal operation of the synchronous semiconductor device, a next generation SDRAM, allowing the word line activating period required in the burn-in stress test to be configured in an effective way. Furthermore, this may increase the rate of duration of the word line activation so as to shorten the period of the test. In addition, the input timing of the asynchronous activating signal may be readily adjusted for each test or during a test in an arbitrary manner so as to always optimize the test efficiency.

In the third preferred embodiment, although an exemplary circuit has been described by way of example in which an accessing command READ_CMD served as a control command CMD is input in synchronism with the rising edge of a external clock CLK while a low-level precharging control signal TXPRE is input in synchronism with the falling edge of the immediately preceding external clock CLK, the relationship between the activating signal and the precharging signal may be reversed. Namely, the accessing command READ_CMD may be input in synchronism with the falling edge timing of an external clock CLK an appropriate period of time after receiving a precharging command PRE_CMD in synchronism with the rising edge timing of the external clock. In the latter case if the interval between a precharging command PRE_CMD and an accessing command READ_CMD is appropriately adjusted, a word line will be activated after a least minimum precharging period required so that the electrical stress may be applied at the maximum rate of time in a burn-in stress test, allowing a more effective burn-in stress test to be carried out. It is to be noted here that the accessing command READ_CMD in synchronism with the falling edge timing of an external clock CLK is an activating signal according to the second aspect, or a second synchronization control signal from an external source.

The accessing command READ_CMD to be input to the synchronous semiconductor device that is the next generation SDRAM, in response to the external signal input through a proprietary external terminal or an existing external terminal will be supplied in synchronism with the falling edge of the external clock CLK not used in the normal operation. The relationship between the rising edge and the falling edge may be arbitrarily configurable, and the word line activation period may be set after an arbitrary period of time following a rising edge of the external clock CLK, which transit a word line activating signal WL to the resetting period which is in the inactivated state. The word line activating period in the burn-in stress test may be arbitrarily configured while making use of the synchronization inactivating signal precharging command PRE_CMD in synchronism with the external clock CLK in the normal operation of the synchronous semiconductor device, a next generation SDRAM, allowing the word line activating period required in the burn-in stress test to be configured in an effective way. In addition, this may increase the rate of duration of the word line activation so as to shorten the period of the test. Furthermore, the timing of a falling edge with respect to a rising edge of the external clock CLK and the input timing of the accessing command READ_CMD may be readily adjusted for each test or during a test in an arbitrary manner so as to always optimize the test efficiency.

In accordance with the present invention, a synchronous semiconductor device and an inspection system thereof may be provided which may improve the efficiency of application of electrical stresses to the device in order to efficiently carry out a burn-in stress test, by reducing the duration of inactivated state to the least minimum in the test to allow the duration of activated state to be arbitrarily configurable so as to increase the rate of duration of active state.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalent.

What is claimed is:

1. An inspection system of synchronous semiconductor device alternately transiting between an activated state and an inactivated state in order to carry out a test in the activated state, comprising: a synchronization signal supplier unit for supplying synchronization signals to the synchronous semiconductor device; a synchronization activating signal supplier unit for supplying synchronization activating signals to the synchronous semiconductor device in synchronism with first synchronization timing of the synchronization signal; an inactivating signal supplier unit for supplying inactivating signals to the synchronous semiconductor device a predetermined period of time before the activated state.

2. An inspection system of the synchronous semiconductor device set forth in claim 1, wherein:
the inactivating signals are generated based on one or more first asynchronous control signals input from an external source.

* * * * *